(12) United States Patent
Chi et al.

(10) Patent No.: US 8,574,927 B2
(45) Date of Patent: Nov. 5, 2013

(54) MAGNETIC TUNNEL JUNCTION DEVICE AND ITS FABRICATING METHOD

(75) Inventors: Min-Hwa Chi, Beijing (CN); Xiufeng Han, Beijing (CN); Guoqiang Yu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/335,882

(22) Filed: Dec. 22, 2011

(65) Prior Publication Data

US 2013/0099335 A1    Apr. 25, 2013

(30) Foreign Application Priority Data

Oct. 19, 2011    (CN) .......................... 2011 1 0318281

(51) Int. Cl.
*H01L 21/8246*    (2006.01)
(52) U.S. Cl.
USPC ............... 438/3; 257/E21.665; 257/E27.104; 257/295; 365/171; 365/158

(58) Field of Classification Search
USPC .................. 365/171, 158, 66, 55, 173, 225.5; 257/295, E27.104
See application file for complete search history.

(56) References Cited

U.S. PATENT DOCUMENTS

| | | | |
|---|---|---|---|
| 7,333,359 B2 * | 2/2008 | Asao et al. ..................... | 365/158 |
| 7,705,340 B2 * | 4/2010 | Lin .................................. | 257/2 |
| 7,919,794 B2 * | 4/2011 | Gu et al. ....................... | 257/241 |
| 2013/0119497 A1 * | 5/2013 | Li .................................. | 257/421 |

* cited by examiner

*Primary Examiner* — Zandra Smith
*Assistant Examiner* — Paul Patton
(74) *Attorney, Agent, or Firm* — Innovation Counsel LLP

(57) ABSTRACT

Using a damascene process, a cup-shaped MTJ device is formed in an opening within a dielectric layer. A passivation layer is formed on the top surfaces of the sidewalls of the cup-shaped MTJ device to enclose the top of the sidewalls, thereby reducing magnetic flux leakage. Accordingly, the MTJ device may be fabricated using the same equipment that are compatible with and commonly used in CMOS technologies/processes.

20 Claims, 4 Drawing Sheets

MAGNETIC TUNNEL JUNCTION DEVICE AND ITS FABRICATING METHOD

This application claims priority to Chinese Patent Application No. 201110318281.1, filed on Oct. 19, 2011 and entitled "A NOVEL MAGNETIC TUNNEL JUNCTION DEVICE AND ITS FABRICATING METHOD", which is incorporated herein by reference in its entirety.

BACKGROUND OF THE INVENTION

1. Field of the Invention

The present invention relates to semiconductor devices, and more particularly to a magnetic tunnel junction (MTJ) device and its fabricating method.

2. Description of the Related Art

MRAM (Magnetic Random Access memory) is a nonvolatile magnetic random access memory, which has the advantages of high speed access to static random access memory (SRAM), high integration of dynamic random access memory (DRAM), and almost infinite writing cycles. As such, MRAMs have attracted attention.

A conventional MRAM performs its storage function based on its magnetic tunnel junction (MTJ) structure and electron spin polarization effect. Research on MRAMs, which are also used as sensors, is ongoing.

FIGS. 1 to 5 are cross-sectional views associated with a conventional MTJ. FIG. 1 is a simplified cross-sectional view of a semiconductor device having an underlying layer 103 (herein, only a part of the device is shown for simplicity), a first dielectric layer 100 formed on layer 103, a tungsten plug formed in the first dielectric layer 100 and in contact with layer 103, and a second dielectric layer 102 formed on the first dielectric layer 100. As shown in FIG. 2, an opening is formed in second dielectric layer 102, and MTJ 104 is formed in the opening. As shown in FIG. 2, MTJ 104 includes, in part, a top electrode 1041, a first synthetic anti-ferromagnetic material (SAF) layer 1042, a tunnel dielectric layer 1043, a second synthetic anti-ferromagnetic material (SAF) layer 1044, an anti-ferromagnetic pinning layer 1045 and a bottom electrode 1046. The first SAF layer 1042 further includes, in part, a first free sublayer (ferromagnetic material), a Ru layer and a second free sublayer (ferromagnetic material). Since the first SAF layer 1042 includes such a tri-layered structure, magnetic flux will loop within it, thus reducing flux leakage. The second SAF 1044 layer has a similar tri-layered structure as well. Although the second SAF 1044 layer is pinned by the anti-ferromagnetic pinning layer 1045 beneath, in some implementations it is not necessary to pin the second SAF 1044, and thus the anti-ferromagnetic pinning layer 1045 can be omitted. Further, although magnetic flux loopings toward the same direction are shown (see solid arrows) in the figure, the loop direction of magnetic flux lines in the first SAF 1042 can be reversed to represent the storage of 1 or 0.

FIG. 2 shows an MTJ structure. Following the processes used to from the MTJ as shown in FIG. 2, the MTJ 104 is patterned with a mask. For example, the MTJ 104 is etched, merely a portion of the MTJ 104 located on the contact 101 is retained as shown in FIG. 3. In conventional MTJ processes, etching method such as FIB or plasma etching or the like can be used for the purpose of lowering cost and achieving minimized MTJ pattern. Next, as shown in FIG. 4, a dielectric layer 105 is deposited and planarized to fill up the opening. Last, within the opening an electric contact, for example, a tungsten plug is formed for the MTJ 104 and a metal layer 106 is disposed on the second dielectric layer 102.

In the existing techniques, in order to enhance the magnetism of ferromagnetic materials (Fe, Co, Ni), it is common to add Fe component to various ferromagnetic materials. Generally, a ferromagnetic material contains about 80% Co, about 19% Ni, and about 1% Fe, and it is important to add Fe to ferromagnetic materials for their magnetism. Different manufactures provide different ferromagnetic material compositions. Nevertheless, Fe component is always added for magnetism enhancement.

However, adding Fe is incompatible with CMOS processes, while Ni and Co are common elements used in CMOS processes. Since Fe is incompatible with CMOS processes, the manufacture of MTJ can not share a manufacturing line of CMOS processes, and additional equipments need to be provided. For example, when depositing a multi-layer MTJ structure, some dedicated equipments should be additionally introduced to construct a Fe-contained MTJ multi-layer structure. In subsequent processes, moreover, other dedicated etching equipments are needed to etch the Fe-contained MTJ multi-layer structure as well.

Further, for magnetism enhancement, a tri-layered synthetic anti-ferromagnetic material layer is employed to enable magnetic flux to loop between a first sublayer and a second sublayer to prevent the magnetic flux leakage. However, the tri-layered structure may lead to an increased size of devices, which is disadvantageous for semiconductor devices with increasingly reduced dimensions.

On the other hand, as is well known, the tunnel dielectric layer 1043 has a thickness of about only 1-2 nanometers. When the layer 1043 is etched as shown in FIG. 3, it is exposed by the etching step, and the edge of the tunnel dielectric layer 1043 is damaged in the etching process, which is disadvantageous to a MTJ for memory devices. Damaged tunnel dielectric layer 1043 may increase leakage current and error rate of stored data. Therefore, in the prior art, MTJ based etching processes have very low yield rate, resulting in the need to introduce dedicated equipments that are often expensive.

In summary, all of above may increase MTJ manufacturing cost.

On the other hand, in practice, there are many sophisticated manufacturing lines for CMOS. Hence, it would be ideal to fabricate MTJ with CMOS processes.

BRIEF SUMMARY OF THE INVENTION

According to one aspect of the present invention, there is provided a MTJ semiconductor device, comprising a first dielectric layer with an opening provided therein; and a cup-shaped MTJ located in that opening.

In one embodiment, the MTJ is made of a magnetic material free of Fe.

In one embodiment, the MTJ in shape is in conformity with the opening.

In one embodiment, the MTJ has a sidewall portion located on the sidewalls of the opening, and a bottom portion located on the bottom of the opening.

In one embodiment, the cup-shaped MTJ is formed in the opening through a damascene process.

In one embodiment, a passivation layer is provided on the top of the sidewalls of the cup-shaped MTJ for enclosing the top edge of the MTJ sidewalls.

In one embodiment, the passivation layer is formed through sputtering or implanting Si, followed by rapid annealing oxidation.

In one embodiment, the passivation layer has a thickness of 5 nm to 30 nm.

In one embodiment, the MTJ comprises two single-layered magnetic material layers.

In one embodiment, a single-layered magnetic material layer is a synthetic anti-ferromagnetic material layer composed of three layers, that is, ferromagnetic material layer—non-ferromagnetic material layer—ferromagnetic material layer.

In one embodiment, the MTJ further comprises from bottom to top: a bottom electrode, a first single-layered magnetic material layer, a tunnel dielectric layer, a second single-layered magnetic material layer, and a top electrode.

In one embodiment, the MTJ further comprises an anti-ferromagnetic pinning layer between the first magnetic material layer and the bottom electrode.

In one embodiment, the MTJ semiconductor device further comprises: a second dielectric layer for filling up the cup-shaped MTJ; a first electric contact electrically connected to the bottom electrode of the MTJ, the first electric contact electrically connecting the MTJ to a completed semiconductor device beneath the MTJ; a second electric contact in the cup-shaped MTJ in contact with the top electrode of the MTJ; a metal layer located above the MTJ and electrically connected to the second electric contact.

In accordance with one aspect of the present invention, there is provided a method for fabricating MTJ, comprising forming a first dielectric layer on a completed underlying semiconductor device, forming an opening in the first dielectric layer; and forming a MTJ within in the opening through a damascene process, the MTJ being in the shape of a cup.

In one embodiment, the step of forming a MTJ within the opening through a damascene process further comprises subsequently depositing a bottom electrode layer, a first single-layered magnetic material layer, a tunnel dielectric layer, a second single-layered magnetic material layer, and a top electrode; depositing a second dielectric layer; removing the MTJ at the outside of the opening and the second dielectric layer through a CMP process until the first dielectric layer is exposed.

In one embodiment, the method further comprises: forming a passivation layer on the top of the sidewalls of the cup-shaped MTJ.

In one embodiment, the method further comprises: sputtering or implanting Si on the top of the sidewalls of the cup-shaped MTJ; forming the passivation layer on the top of the sidewalls of the cup-shaped MTJ through rapid thermal annealing.

In one embodiment, the method further comprises: arranging a first metal contact, the first metal contact electrically connecting the MTJ to the completed semiconductor device beneath the MTJ; forming a second electric contact in the second dielectric layer; forming a metal layer over the MTJ, the second electric contact electrically connecting the top electrode of the MTJ to the metal layer.

According to one aspect of the present invention, there is also provided a magnetic memory device, comprising the magnetic tunnel semiconductor device according to any one of the above aspects of this invention.

BRIEF DESCRIPTION OF THE DRAWINGS

This invention will be better understood by reading the following detailed description with reference to accompanying drawings, in which the similar reference labels are used to refer to the similar elements, and wherein.

It is understood, for the simplicity and clarity of description, that these drawings are not drawn to scale. For example, for facilitating and improving clarity and understandability, some elements are scaled up with respect to other elements. Furthermore, in these drawings, similar labels are used to represent corresponding or similar elements.

DETAILED DESCRIPTION OF THE INVENTION

Ferromagnetic materials compatible with CMOS processes, that is, ferromagnetic materials free of Fe, are used in embodiments of the present invention. Accordingly, fabrication of an MTJ, in accordance with embodiments of the present invention, is carried out using existing CMOS manufacturing lines, this dispensing the need for additional expensive dedicated equipments. Furthermore, MTJ may be fabricated using a damascene process, thus avoiding the device damage that would be otherwise caused by the etching process. In some embodiments, single-layered magnetic material layers may be used to reduce device size. Therefore, a MTJ in accordance with the embodiments of the present invention has an improved signal quality and a reduced magnetic flux leakage.

Figure 1:
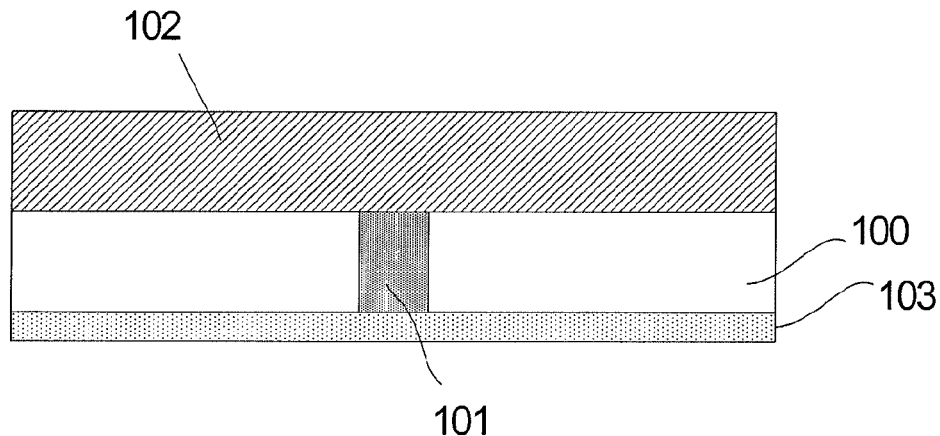
FIGS. 1 to 5 are cross-sectional views of a MTJ device during various processing stages as known in the prior art.
Figure 2:
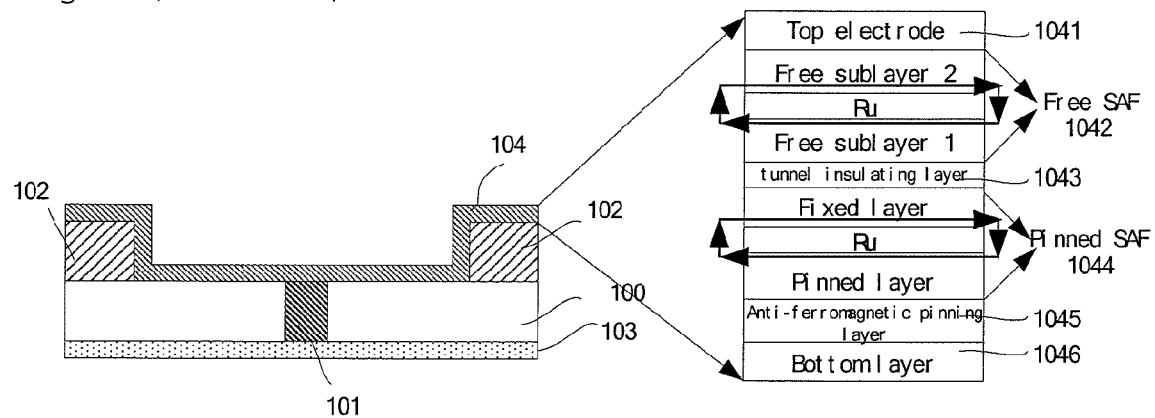
Figure 3:
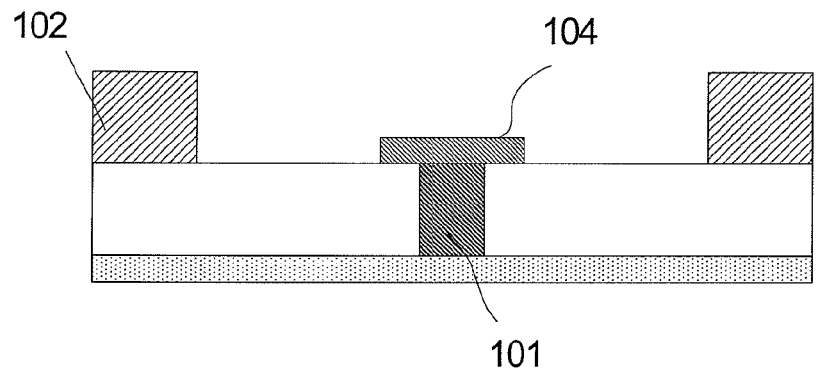
Figure 4:
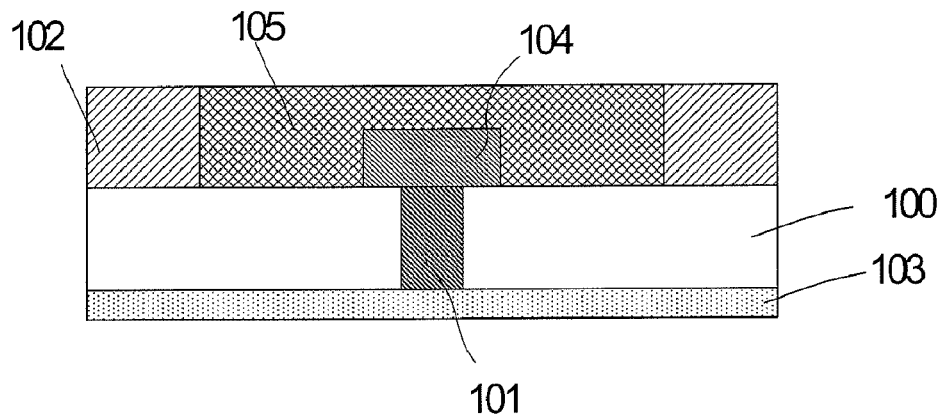
Figure 5:
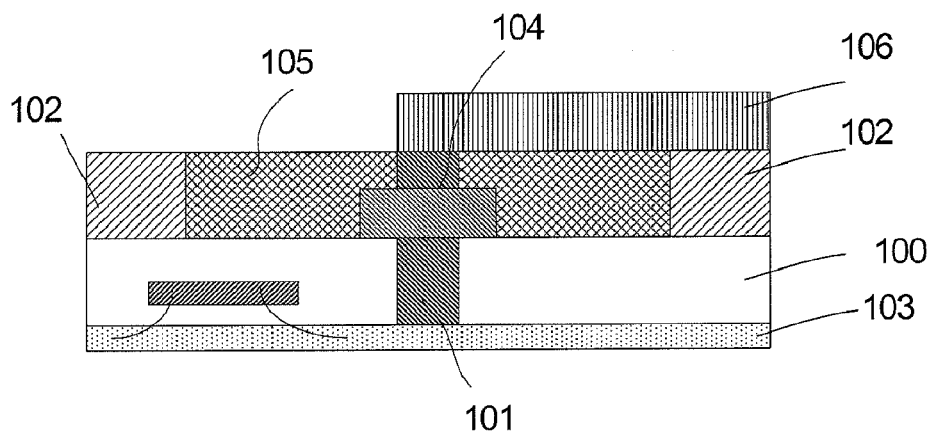
Figure 6:
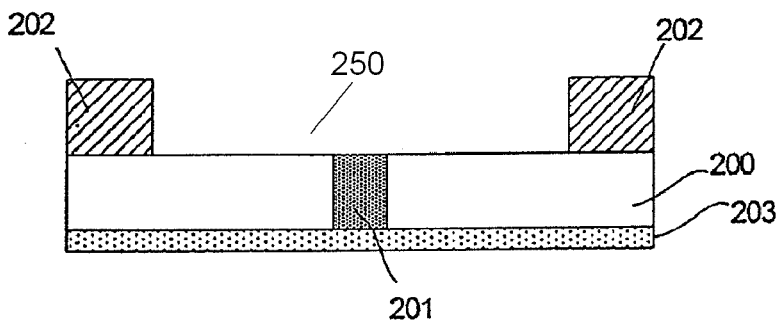
FIGS. 6 to 10 are cross-sectional views of a MTJ device during various processing stages according to embodiments of the present invention.

Referring to FIG. 6, the MTJ is formed over layer 203, which for simplicity is shown as a single layer but may include multiple layers and structures. As seen, a first dielectric layer 200 is deposited on layer 203, and an electric contact 201 is formed in the first dielectric layer 200. In one embodiment, the first dielectric layer 200 may be $SiO_2$, and the electric contact 201 can be a tungsten plug. Next, the surface of the first dielectric layer 200 is planarized. A second dielectric layer 202 is deposited on the first dielectric layer 200 to a thickness of 0.3-1 µm. First dielectric layer 200 and second dielectric layer 202 may be formed of the same material.

Figure 7:
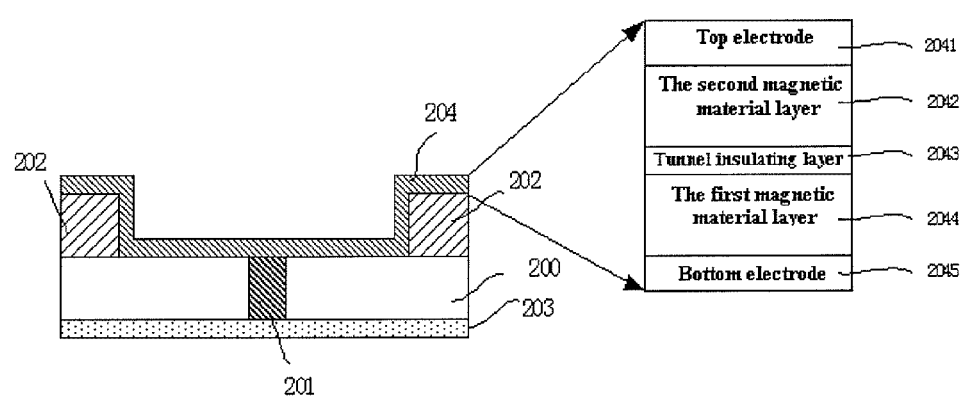

Next, using conventional masking and etching techniques, an opening 250 is formed in the second dielectric layer 202 until the electric contact 201 is exposed. Next, as shown in FIG. 7, multiple layers of the MTJ structure 204 are deposited in the opening. The MTJ structure comprises from bottom to top a bottom electrode 2045, a first single-layered magnetic material layer 2044, a tunnel dielectric layer 2043, a second single-layered magnetic material layer 2042, and a top electrode 2041. Processes for forming the multi-layer structure of MTJ 204 are well known in the art and thus are not described herein. In one embodiment, the bottom electrode 2045 consists of, for example, TaN, and has a thickness of about 5 nm. The first magnetic material layer 2044 consists of, for example, Co with a thickness of about 10-30 nm. The tunnel dielectric layer 2043 consists of, for example SiN, $SiO_2$, $Al_2O_3$ or $HfO_2$, with a thickness of about 1-2 nm. The second magnetic material layer 2042 consists of, for example Co, with a thickness of about 10-30 nm. The top electrode 2041 consists of, for example TaN, with a thickness of about 5 nm. In such embodiments, both the first magnetic material layer 2044 and the second magnetic material layer 2042 are free magnetic material layers (i.e., the layers are not pinned or fixed), and their polarities can be varied depending upon specific applications. Since the method firstly forms an opening and then carries out the deposition, so-called damascene process, the MTJ 204 has a shape that substantially conforms with the shape of the opening. More particularly, the sidewalls of the MTJ 204 are positioned above the sidewalls of the opening within the second dielectric layer 202, and the bottom of the MTJ 204 is positioned above the bottom of the opening within the second dielectric layer 202. As shown in FIG. 7, the MTJ 204 is thus formed in the shape of a cup.

Figure 8:
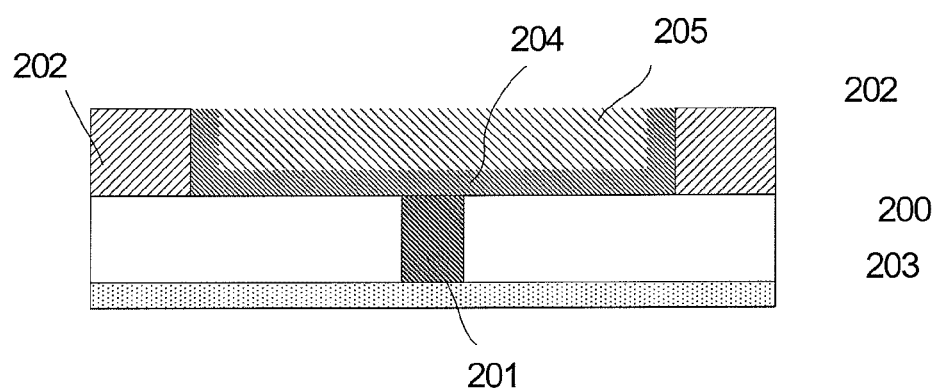

As shown in FIG. 8, the portions of deposited layers of MTJ structure 204 outside the opening 250 are removed by chemical mechanism polishing (CMP), and then a second dielectric layer 205 is deposited on the MTJ 204. The dielectric layer 205 may be made of the same material as the dielectric layer 202. The second dielectric layer 205 is then removed using a CMP technique until the MTJ 204 is exposed, as shown in FIG. 8.

Figure 9:
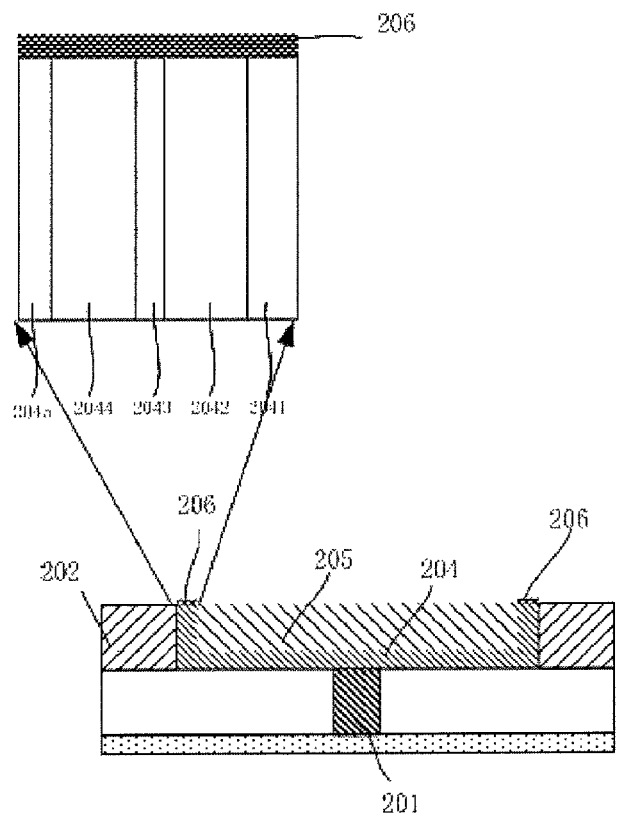

As shown in FIG. 9, a passivation layer 206 is formed on the top surface of the sidewalls of the MTJ 204, for example, by depositing dielectric materials, such as $SiO_2$. The top surfaces of the sidewalls of the MTJ 204 are thus sealed by the passivation layer 206. As shown in FIG. 9, when the MTJ 204 is formed with a damascene process, the sidewall surfaces of the MTJ 204 are exposed. This exposure is likely to cause magnetic flux leakage from the exposed edges, thus degrading retention and fault-tolerance capability of the device. In accordance with one aspect of the present invention, passivation layer 206 seals the surfaces of the MTJ 204. Accordingly, substantially no magnetic flux leakage from the surfaces may occur, and a closed loop of magnetic flux lines can be formed in the cup-shaped MTJ 204, thus improving the performance of MTJ 204.

Although the passivation layer 206 in FIG. 8 is shown as being formed on the top surfaces of the sidewalls of the MTJ 204, it is understood that in other embodiments, the entire surface of the structure may be covered with a passivation layer 206. For example, passivation layer 206 may be of the same material as dielectric layer 205 and dielectric layer 202 thus enabling passivation layer 206 to be formed on the entire surface of the structure, in turn simplifying the process. In one embodiment, passivation layer 206 may be formed through rapid annealing oxidation after sputtering (Si). In another embodiment, passivation layer 206 may be formed through rapid annealing oxidation after implantation (Si). In one embodiment, the passivation layer 206 may have a thickness of 5 nm to 30 nm.

Figure 10:
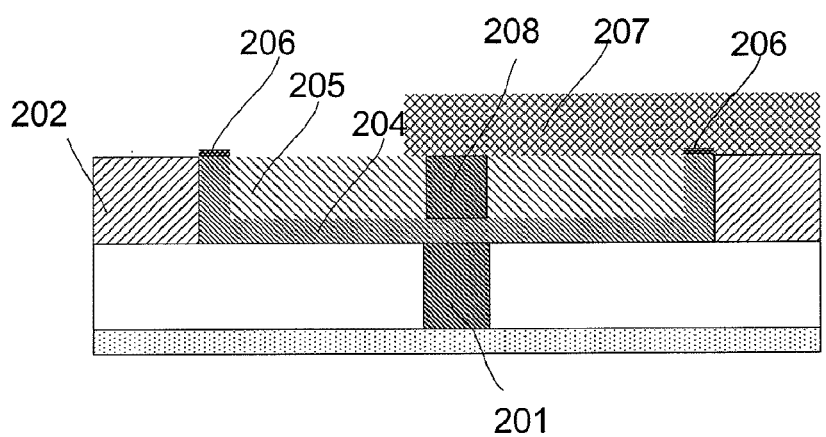

Next, as shown in FIG. 10, another electric contact 208 is formed in the second dielectric layer 205 as well known in the art; a metal layer 207 is formed on the top of the device and is electrically connected to the electric contact 208.

Although the above descriptions of exemplary embodiments of the present invention are made with reference to a simplified MTJ having single-layered magnetic material layers, it is understood that other embodiments of the present invention may include multiple-layered synthetic anti-ferromagnetic material layers free of Fe. For example, in one embodiment, a tri-layered synthetic anti-ferromagnetic material layer composed of a magnetic material layer having no Fe contained (such as, Co, Ni), a layer of common metal (such as, Al), a magnetic material layer having no Fe contained (such as, Co, Ni) may be used. When the synthetic anti-ferromagnetic material layer is used, the performance of the magnetic material layers can be further improved.

As mentioned above, CMOS compatible ferromagnetic materials are used in various embodiments of the present invention to dispense the need for Iron (Fe) in the MTJ. This enable the fabrication of the MTJ with equipments that are commonly used in CMOS processes, thereby to reduce the cost. For example, etching equipments can also be replaced with damascene process equipments. Furthermore, in accordance with the present invention, an MTJ structure has a reduced size. Performance enhancements can be further achieved by using advanced circuit techniques. As described above, in one embodiment, a passivation layer is used to seal the exposed top surfaces of the MTJ sidewalls so as to repair any damage that may occur in the MTJ tunnel dielectric layer 2043 during the CMP process, to improve the yield and performance of the cup-shaped MTJ structure, and optimize magnetic flux lines. Furthermore, an anti-ferromagnetic pinned layer may also be used.

Furthermore, although some oxide or nitride dielectric layers are shown as single layers in the drawings and this description, those skilled in the art will appreciate, however, one or more oxide or nitride dielectric layers can be adopted depending on specific applications, and in so doing, the process can be changed according to the components of selected dielectric layers.

Although this invention has been specifically described incorporating with specific preferable embodiments, many selections, modifications and changes can be made by those skilled in the art from the previous description. Thus, any such selection, modification and change falling within the real scope and substance of this invention are intended to fall within the scope of the appended claims.

What is claimed is:

1. A semiconductor structure comprising: a substrate; a first dielectric layer formed above the substrate, said first dielectric layer comprising an opening; a cup-shaped magnetic tunnel junction (MTJ) device formed in the opening; and a dielectric member disposed inside a cup-shaped cavity defined by the MTJ device.

2. The semiconductor structure according to claim 1 wherein the MTJ device consists of a magnetic material free of Iron.

3. The semiconductor structure according to claim 1 wherein the MTJ device has a shape that substantially conforms with a shape of the opening.

4. The semiconductor structure according to claim 3 wherein sidewalls of the MTJ device are adjacent sidewalls of the opening, and wherein a bottom portion of the MTJ device is disposed above a bottom of the opening.

5. The semiconductor structure according to claim 1 wherein the MTJ device is formed in the opening using a damascene process.

6. The semiconductor structure according to claim 1 wherein the semiconductor structure further comprises a passivation layer overlaying top surfaces of the sidewalls of the MTJ device.

7. The semiconductor structure according to claim 6 wherein the passivation layer has a thickness of 5 nm to 30 nm.

8. The semiconductor structure according to claim 1 wherein the MTJ device comprises at least two layers of magnetic materials wherein each of the at least two layers consists of a single layer of magnetic materials.

9. The semiconductor structure according to claim 8 wherein at least one of the magnetic material layers is a synthetic anti-ferromagnetic material layer comprising a ferromagnetic material layer, a non-ferromagnetic material layer, and a ferromagnetic material layer.

10. The semiconductor structure according to claim 8 wherein the MTJ device comprises a bottom electrode, a first magnetic material layer, a tunnel dielectric layer, a second magnetic material layer, and a top electrode.

11. The semiconductor structure according to claim 10 further comprising an anti-ferromagnetic pinning layer disposed between the first magnetic material layer and the bottom electrode.

12. The semiconductor structure according to claim 1 further comprising:

a second dielectric layer covering a top and sidewalls of the MTJ device;

a first contact connected to a bottom electrode of the MTJ device;

a second contact disposed in the second dielectric layer and being in contact with a top electrode of the MTJ device; and a metal layer formed above the MTJ device and coupled to the second electric contact.

13. A method for fabricating a semiconductor structure, the method comprising:

forming a first dielectric layer above a substrate;

forming an opening in the dielectric layer; and forming a magnetic tunnel junction (MTJ) device in the opening using a damascene process, the MTJ device being of a cup shape.

14. The method according to claim 13 wherein the forming of the MTJ device in the opening further comprises:

depositing a bottom electrode layer in the opening;

forming a first magnetic material layer above the bottom electrode layer;

forming a tunnel dielectric layer above the first magnetic material;

forming a second magnetic material layer above the tunnel dielectric layer;

forming a top electrode layer above the second magnetic material layer;

depositing a second dielectric layer above the top electric layer; and performing a chemical mechanical polishing until the first dielectric layer is exposed.

15. The method according to claim 14 further comprising:

forming a passivation layer on top surfaces of the sidewalls of the MTJ device.

16. The method according to claim 15 further comprising:

sputtering or implanting Silicon on the top surfaces of the sidewalls of the MTJ device; and forming the passivation layer on the top surfaces of the sidewalls of the MTJ device using rapid thermal annealing.

17. The method according to claim 16 further comprising:

forming a first metal contact coupled to a bottom electrode of the MTJ device;

forming a second contact in the second dielectric layer; and forming a metal layer over the MTJ device, the second electric contact electrically connecting a top electrode of the MTJ device to the metal layer.

18. A semiconductor structure comprising:

a substrate;

a first dielectric layer formed above the substrate, said first dielectric layer comprising an opening;

a magnetic tunnel junction (MTJ) device formed in the opening; and a passivation layer overlaying at least a top surface of at least a sidewall of the MTJ device, wherein the passivation layer and the first dielectric layer are formed of a same material.

19. The semiconductor structure according to claim 18 wherein the passivation layer contacts at least a first electrode of the MTJ device and a magnetic material layer of the MTJ device.

20. The semiconductor structure according to claim 18 further comprising a dielectric member disposed inside the MTJ device, wherein the passivation layer and the dielectric member are formed of the same material.

* * * * *